(12) United States Patent
Merritt

(10) Patent No.: US 10,573,344 B2
(45) Date of Patent: Feb. 25, 2020

(54) SLOT SYNTHESIS FOR HIGH CARDINALITY PULSE POSITION MODULATION

(71) Applicant: U.S.A., as represented by the Administrator of the National Aeronautics and Space Administration, Washington, DC (US)

(72) Inventor: Scott A. Merritt, McLean, VA (US)

(73) Assignee: U.S.A. as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 15/627,658

(22) Filed: Jun. 20, 2017

(65) Prior Publication Data
US 2018/0366159 A1    Dec. 20, 2018

(51) Int. Cl.
| | |
|---|---|
| *G11B 20/16* | (2006.01) |
| *H03K 3/02* | (2006.01) |
| *H03D 3/24* | (2006.01) |
| *H04B 1/69* | (2011.01) |

(52) U.S. Cl.
CPC ............ *G11B 20/16* (2013.01); *H03D 3/24* (2013.01); *H03K 3/02* (2013.01); *H04B 1/69* (2013.01)

(58) Field of Classification Search
CPC .. H03K 3/02; H03K 3/64; H03K 3/66; H03K 3/70; H03K 3/72; H03K 3/78; H03K 9/00; H03K 9/04; H03K 9/06; H03K 7/00; H03K 7/04; H03K 7/06; H03D 3/02; H03D 3/04; G11B 20/16; G11B 20/14; G11B 20/1403; G11B 20/1411; G11B 20/1415; H04L 25/4902
USPC ......................................... 375/239
See application file for complete search history.

(56) References Cited

U.S. PATENT DOCUMENTS

| | | | | |
|---|---|---|---|---|
| 4,133,979 | A * | 1/1979 | Helliwell | H04Q 1/4575 370/525 |
| 4,584,720 | A * | 4/1986 | Garrett | H01S 3/10 370/213 |
| 4,648,133 | A * | 3/1987 | Vilnrotter | H04L 7/0066 329/313 |
| 5,243,626 | A * | 9/1993 | Devon | H04L 7/0066 375/239 |
| 6,219,380 | B1 * | 4/2001 | Wang | H03K 7/04 329/313 |
| 9,264,147 | B2 * | 2/2016 | Caplan | H04B 10/5561 |
| 2007/0276891 | A1 * | 11/2007 | Warner | G06F 1/025 708/277 |
| 2008/0303575 | A1 * | 12/2008 | Ikeda | H03K 3/78 327/295 |
| 2017/0222720 | A1 * | 8/2017 | Farr | H04B 10/54 |

* cited by examiner

*Primary Examiner* — Jason Crawford
(74) *Attorney, Agent, or Firm* — Christopher O. Edwards; Bryan A. Geurts

(57) ABSTRACT

The present invention relates to a slot clock generator for high data rate pulse position modulation (PPM), including: a set of clocks with predetermined frequencies that are mutually prime in pairs, the set of clocks which synthesizes and accumulates changes in clock states at a rate corresponding to a slot rate that is greater than a slot rate of any single clock in the set.

2 Claims, 2 Drawing Sheets

SLOT SYNTHESIS FOR HIGH CARDINALITY PULSE POSITION MODULATION

ORIGIN OF THE INVENTION

The invention described herein was made by an employee of the United States Government, and may be manufactured or used by or for the Government for governmental purposes without the payment of any royalties thereon or therefor.

BACKGROUND OF THE INVENTION

1. Field of the Invention

The present invention relates to an improved slot clock generator for high data rate, high cardinality, high sensitivity pulse position modulation (PPM), which, instead of using a single high slot-clock rate, synthesizes a high rate of clock state changes with a set of clocks with predetermined chosen frequencies, which set of clocks accumulate state changes at a slot rate that is unachievable by a single clock.

2. Description of the Related Art

Pulse Position Modulation (PPM) suffers from difficulties in clock generation and clock recovery (both slot clock and word clock) because the transition density is lower than other communications formats, and because the desired PPM slot clock rates can exceed the electronic limits of conventional semiconductor technology. Existing slot clock generators have technical limits to speed (e.g., caused by semiconductor feature sizes, device capacitance, and other limitations) that constrain optical communications to lower speeds than desired. Conventional PPM's problems with technology limited clock rates arise in implementations that use a single high rate slot clock.

Transition density is inversely related to PPM cardinality so these problems are exacerbated when the cardinality, and hence the photon-efficiency, of a conventional PPM signal is high. Low transition density leads to both an increase in the uncertainty in clock phasing (i.e., phase jitter), and an increase in the probability of a cycle slip (i.e., mistaking one PPM slot or PPM word for another). For example, when using any communication system that uses a pulse position modulation (PPM) signaling format, it is difficult to find a means of reaching high PPM slot rates in the transmitter, the receiver, or both.

Thus, the sensitivity advantage of PPM comes at the cost of a lower data rate when either: 1) the slot-clock rate or electronic bandwidth reaches its technology-specific frequency limit, or 2) the jitter in a detection or slot-clock approaches a slot's temporal width. With respect to the second situation, any temporal offset or jitter in the boundaries of a slot directly affects the result of the temporal integration over the slots of PPM words, comprising scalar (i.e., single channel) slots, and, consequently, degrades the performance of the entire system.

Thus, it is an object of the present invention to overcome the slot-clock and electronic rate limit and mitigate the effects of jitter, thus, enabling both high sensitivity and high data rate communication using PPM.

SUMMARY OF THE INVENTION

The present invention relates to an improved slot clock generator for high data rate, high cardinality, high sensitivity pulse position modulation (PPM), which, instead of using a single high slot-clock rate, synthesizes a high rate of clock state changes with a set of clocks with predetermined chosen frequencies, which clocks accumulate state changes at a slot rate that is unachievable by a single clock.

In one embodiment, the present invention relates to a slot clock generator for high data rate pulse position modulation (PPM), including: a set of clocks (that can be thought of as comprising the elements of a vector) with frequencies that are prime harmonics of a vector PPM word frequency, the set of clocks which synthesizes and accumulates changes in clock states at a rate corresponding to a slot rate for a synthetic slot clock that is greater than a slot rate of any single clock in the set.

In one embodiment, a minimal (i.e. smallest plurality) set of clocks operating at prime harmonic frequencies of the vector PPM word frequency or word rate have a composite modulus that is minimally larger than a cardinality of the synthetic PPM signal. In one embodiment, the frequency of the highest frequency clock of the set is the smallest it can be while the set produces the smallest composite modulus that exceeds the synthetic PPM cardinality.

In one embodiment, the vector PPM signal is a composite signal including two or more modulation dimensions. For example, a vector PPM signal that, in addition to asserting a slot and not asserting at least one other slot at the rate of one clock in the set, encodes a polarization, phase, optical channel wavelength, optical channel frequency, optical channel wavelength, or RF channel frequency in the asserted slot and similarly encodes a modulation dimension in a slot at the rate of another, distinct and relatively prime clock in the set. For example, for synthetic quaternary PPM, i.e. 4-PPM, where M=4, may assert one of two slots at one optical wavelength and one of three slots at a second optical wavelength, thereby implementing a signal having a composite modulus of S=6 that can be decoded at a synthetic slot rate using the Chinese Remainder Theorem, lookup tables, and the like.

In one embodiment, the slot clock generator further includes a precession counter which maintains phasing of a vector PPM word rate to the synthetic slot clock, by at least one of re-mapping the synthetic clock slot to a vector PPM slot, resetting clock-set counters at an end of each vector PPM word, or introducing dead times after each PPM word to align each of the clock states to a vector PPM word boundary, thereby lowering a data rate. For example, for 4-PPM, the set of clocks operating at double and triple times the vector PPM word rate, i.e. having a composite modulus of 6, the precession counter can determine whether a decoded synthetic slot falls in the first or second half of a synthetic PPM word.

In one embodiment, a slot clock generator for high data rate pulse position modulation (PPM), includes: a set of clocks with predetermined frequencies that are both mutually prime in pairs and harmonics of a vector PPM word rate, the set which synthesizes and accumulates changes in clock states at a rate corresponding to a slot rate for a synthetic slot clock that is greater than a slot rate of any single clock in said set.

In one embodiment, the Chinese Remainder Theorem (CRT) is used to synthesize said slot rate of said clock states by solving a set of simultaneous modular equations on said clock states by producing a composite modulus that is larger than a cardinality of a PPM signal.

In one embodiment, the PPM signal is a composite signal including two or more modulation dimensions.

In one embodiment, the slot clock generator further includes: a precession counter which maintains phasing of a PPM slot rate to said synthetic slot clock, by at least one of re-mapping said synthetic clock slot to a modulus slot, resetting clock-set counters at an end of each PPM word, or introducing dead times after each PPM word to align each of said clock states to a PPM word boundary, thereby lowering a data rate.

In one embodiment, the set is used in optical communication networks.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The FIG. 1 shows a graph of a simulation in which one varies the asserted slot in 1024 consecutive PPM words and decodes the asserted slot based on the moduli of the clocks in the set, the clock-state accumulators, i.e., counters, and the composite modulus, S, of the set of clocks.

DESCRIPTION OF THE INVENTION

Figure 1:
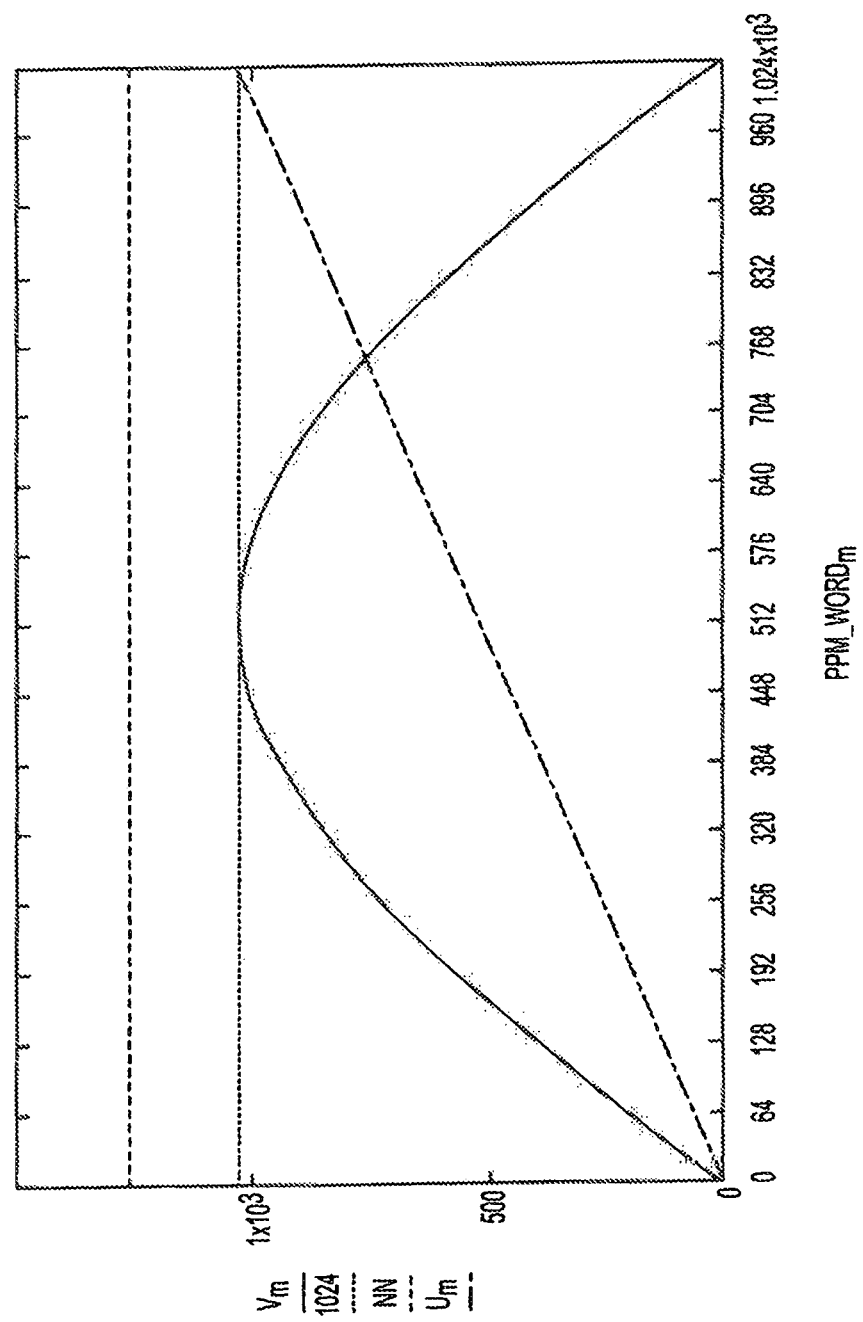
Figure 2:
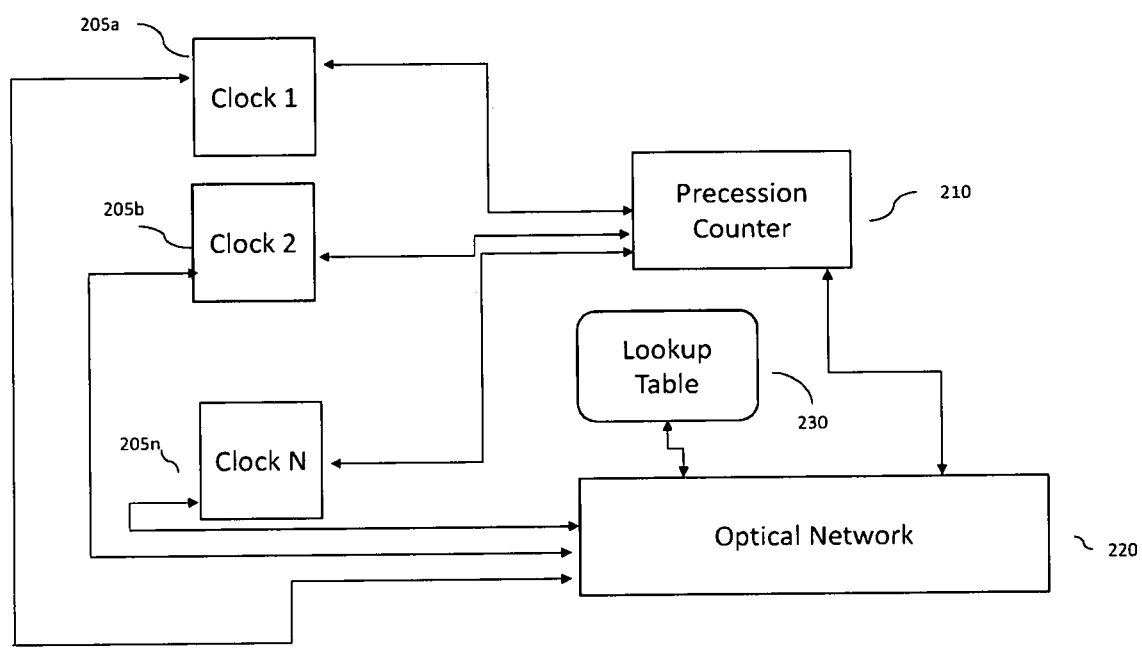
FIG. 2 shows a functional block diagram of the communication network of an embodiment of the invention.

The present invention relates to an improved slot clock generator for high data rate, high cardinality/sensitive pulse position modulation (PPM), which, instead of using a single high slot-clock rate, synthesizes a high rate of clock state changes with a set of clocks with predetermined chosen frequencies, which clocks accumulate state changes at a slot rate that is unachievable by a single clock.

In one exemplary embodiment, the present invention overcomes the technology limits of existing slot clock generators, by using a set of clocks (i.e., pulse sources such as lasers or digitizers), such that the frequency of the fastest clock of the set is minimized, yet where one wants to divide the fundamental period into a number of periods, the number of synthetic divisions of the period of the fundamental frequency exceeds a specified power of two.

More specifically, the present invention uses a set of clocks ($205a$, $205b$ ... $205n$) to resolve time to much less than one fundamental period. Specifically, in one exemplary embodiment, clocks with specially-selected harmonically related frequencies, i.e., harmonically related to a fundamental period and having rates that are mutually prime in pairs, are used.

In one exemplary embodiment, the above applies to both pulse position modulation (PPM), a photon-efficient optical communications format and optical communications with non-PPM or hybrid formats. Other applications of the present invention for fine-grained timing with an optimal or minimal number of speed-limited clocks may include: RF communications, radar, lidar, sonar, and numerous timing applications.

The sensitivity advantage of PPM comes at the cost of a lower data rate when either: 1) the slot-clock rate or electronic bandwidth reaches their technology-specific frequency limit, or 2) the jitter in the detection or slot-clock approaches a slot's temporal width.

In order to realize the benefit of a high effective slot rate, in one exemplary embodiment, the present invention is related to signals that include two or more modulation dimensions, e.g., wavelength or polarization, or both. For example, one can pulse-position modulate one channel of the set at one polarization, and the other channel of the set at an orthogonal polarization. As another example, one can pulse-position modulate at a set of four wavelengths. In both examples, the corresponding single channel or scalar PPM slot rate differs for each modulated wavelength or polarization, but the vector-PPM word rate, R, is constant and the synthetic PPM word rate is either R*S/M or R, depending on whether a precession counter is used, or truncation, or deadtimes, are used, respectively.

Note that vector-PPM using multiple wavelengths is not the same as: 1) a Wavelength Division Multiplexed (WDM) form of conventional PPM, 2) Frequency Shift Keying (FSK), i.e., frequency shifting at a single word or symbol rate, or 3) a WDM form of FSK, and the like. Instead synthetic slots are generated at a rate that no element of the set achieves alone.

PPM offers better sensitivity for laser communications than other forms of modulation. Prior techniques for PPM required using a high frequency slot clock for high cardinality PPM. Sensitivities of 13 bits per incident photon (0.077 photons/bit) have been demonstrated for PPM signals having cardinalities of $M=2^{18}$ to $M=2^{20}$ "slots" at code word error rates (CWER) of $10^{-6}$. At even moderate cardinalities, e.g., M=1024, one can achieve better than 1 photon/bit at channel bit error rates (BERs) suitable for correction with strong forward error correcting codes (FECs), thus, producing low CWERs.

In contrast, in both fully coherent (e.g., PSK) and differential phase formats, depending on the CWER or bit error rate (BER) chosen for reference, the sensitivity requirements of differential phase shift keyed (DxPSK) and xPSK coherent laser communications signal are higher, e.g., 3 to 10 photons per bit, i.e., 5 to 10 dB worse.

With respect to the high data rate, high cardinality/sensitive PPM, it is not necessary to use a single high slot-clock rate for vector-PPM, instead, the present invention synthesizes a high rate of clock state changes with a set of clocks with predetermined chosen frequencies. In fact, the set of clocks accumulates state changes at a rate corresponding to the otherwise, unachievable, slot rate.

In one exemplary embodiment, and as shown in Table 1, for cardinality M=1024, one can select four clocks (corresponding, for example, to four wavelengths) operating at 4, 5, 7, and 9 times the vector-PPM word rate. These low rate clocks supplant a prior art single clock running at 1024 times the PPM word rate or 1024 clocks operating at phase differences of 1/Nth of the PPM word phasing. In the former case, excepting for jitter, if the data rate is limited by clock technology/speed limits, the present invention raises the data rate of PPM by a factor of 1024/9=113, since 9 is the highest frequency clock in the set. In the latter case, the present invention reduces the number of clocks in the set from 1024 to 4.

In one exemplary embodiment, one can decode the asserted slot in either a vector PPM or word or a synthetic PPM word within the vector PPM word by using the Chinese Remainder Theorem (CRT), lookup tables (230), and the like. For example, the CRT provides the means to synthesize high effective clock rates from a set of lower rate clocks using the relationships of Table 2. The CRT, a set of state-counters for each channel's asserted slot, and if used, the precession counter, can determine which synthetic slot clock in a synthetic PPM word has been asserted. The present invention, by design, achieves a set of clocks which produces a composite modulus, S, that is larger than the cardinality of the synthetic PPM signal, M.

For example, for M=1024, the set of four clocks in Table 1 yields a composite modulus of S=1260. The relationship S>M eliminates ambiguity in the assignment of vector PPM slots to synthetic (scalar, single-channel) PPM slots. The approach can assign a time-tag to each scalar PPM detection i.e., each asserted slot in the set of channels, then determine which synthetic slot was asserted.

In one exemplary embodiment, in order to maintain phasing of the desired PPM slot rate to the synthetic slot clock, one can: 1) add a "precession counter" (PC) (210) that re-maps the detected synthetic slot to a modulo-M slot, if precession of the synthetic PPM words with respect to the vector PPM words is designed; 2) reset the clock-set counters at the end of each PPM word if precession is disallowed by design; or 3) introduce dead times after each synthetic PPM word to align the clock-set state to the PPM word boundaries, e.g., introduce 1260−1024=236 dead slots, thus, lowering the data rate by approximately M/S. Choices 1) and 2) do not sacrifice any of the data rate improvement offered with the techniques herein.

Table 1 provides both the number of bits in the precession counter (PC), and for PPM transmitter design, an estimate of the extinction ratio (ER) wanted for high fidelity PPM having less than 0.1 dB degradation in the PPM channel word error ratio loss due to mis-asserted null slots.

The FIGURE shows a simulation in which one varies the asserted slot in 1024 consecutive PPM words. The FIGURE shows the ramp in asserted synthetic PPM slot (magenta) and half-sine in asserted PPM slot (red), decoded with CRT and clock set={4, 5, 7, 9}. In the magenta curve (U), the asserted PPM slot increases by one slot in each word, i.e., in a "walking-ones" pattern. In the red curve (V), the asserted slot increases and decreases in a half-sine pattern, i.e., from the first slot to the last slot then back. In this example, the composite modulus, S=1260 (green), and the cardinality of the synthetic PPM word is M=1024 (blue).

In one exemplary embodiment, a data rate example, the channel bit rate, B, for M-ary PPM is related to the slot clock rate, R, according to:

$$B = \log 2(M) * R/M. \qquad \text{Eq 1)}$$

Alternatively, for a desired channel bit rate and cardinality, M:

$$R = M * B / \log 2(M). \qquad \text{Eq 2)}$$

This means that for high data rate PPM, conventional single-clock PPM easily reaches a technology limit for clock rate, especially for high cardinality. This also means that with conventional PPM, one can pay a steep price for data rate when seeking photon-efficiency.

However, in one exemplary embodiment, provided the PPM design includes a set of low jitter clocks generating a synthetic slot clock rate, $R_{slot}$, one can raise the channel bit rate significantly. For example, assume that the technology for a low-jitter, space-qualifiable slot clock is limited to 9 GHz, so that lower rate clocks at 7, 5, and 4 GHz are also achievable. For this example, the resulting word rate for 1024-PPM is 1 Gword/second. At 10 channel bits per word, the channel rate is 9 Gbps.

TABLE 1

CLOCK RATES RELATIVE TO VECTOR PPM WORD RATE
AS A FUNCTION OF SYNTHETIC PPM CARDINALITY

| BITS/SYMBOL | CARDINALITY | CLOCK RATE1 | CLOCK RATE2 | CLOCK RATE3 | CLOCK RATE4 | CLOCK RATE5 | CLOCK RATE6 | CLOCK RATE7 | STATES |
|---|---|---|---|---|---|---|---|---|---|
| 1 | 2 | 2 | | | | | | | 2 |
| 2 | 4 | 2 | 3 | | | | | | 6 |
| 3 | 8 | 3 | 4 | | | | | | 12 |
| 4 | 16 | 4 | 5 | | | | | | 20 |
| 5 | 32 | 3 | 4 | 5 | | | | | 60 |
| 6 | 64 | 2 | 5 | 7 | | | | | 70 |
| 7 | 128 | 4 | 5 | 7 | | | | | 140 |
| 8 | 256 | 3 | 4 | 5 | 7 | | | | 420 |
| 9 | 512 | 3 | 5 | 7 | 8 | | | | 840 |
| 10 | 1024 | 4 | 5 | 7 | 9 | | | | 1260 |
| 11 | 2048 | 5 | 7 | 8 | 9 | | | | 2520 |
| 12 | 4096 | 3 | 4 | 5 | 7 | 11 | | | 4620 |
| 13 | 8192 | 3 | 5 | 7 | 8 | 11 | | | 9240 |
| 14 | 16384 | 5 | 7 | 8 | 9 | 11 | | | 27720 |
| 15 | 32768 | 5 | 7 | 8 | 11 | 13 | | | 40040 |
| 16 | 65536 | 7 | 8 | 9 | 11 | 13 | | | 72072 |
| 17 | 131072 | 4 | 5 | 7 | 9 | 11 | 13 | | 180180 |
| 18 | 262144 | 5 | 7 | 8 | 9 | 11 | 13 | | 360360 |
| 19 | 524288 | 5 | 7 | 8 | 9 | 13 | 17 | | 556920 |

TABLE 1-continued

CLOCK RATES RELATIVE TO VECTOR PPM WORD RATE
AS A FUNCTION OF SYNTHETIC PPM CARDINALITY

| | | | | | | | | |
|---|---|---|---|---|---|---|---|---|
| 20 | 1048576 | 7 | 8 | 9 | 11 | 13 | 17 | 1225224 |
| 21 | 2097152 | 4 | 5 | 7 | 9 | 11 | 13 | 17 | 3063060 |
| 22 | 4194304 | 5 | 7 | 8 | 9 | 11 | 13 | 17 | 6126120 |

| BITS/SYMBOL | LOG2 (STATES) | GCD | LCM | PRECESSION COUNTER STATES | PC BITS | ER (dB) |
|---|---|---|---|---|---|---|
| 1 | 1.00 | 2 | 2 | 1 | 0 | 18 |
| 2 | 2.58 | 2 | 12 | 2 | 1 | 21 |
| 3 | 3.58 | 4 | 24 | 2 | 1 | 24 |
| 4 | 4.32 | 4 | 80 | 4 | 2 | 27 |
| 5 | 5.91 | 4 | 480 | 8 | 3 | 30 |
| 6 | 6.13 | 2 | 2240 | 32 | 5 | 33 |
| 7 | 7.13 | 4 | 4480 | 32 | 5 | 36 |
| 8 | 8.71 | 4 | 26880 | 64 | 6 | 39 |
| 9 | 9.71 | 8 | 53760 | 64 | 6 | 42 |
| 10 | 10.30 | 4 | 322560 | 256 | 8 | 45 |
| 11 | 11.30 | 8 | 645120 | 256 | 8 | 48 |
| 12 | 12.17 | 4 | 4730880 | 1024 | 10 | 51 |
| 13 | 13.17 | 8 | 9461760 | 1024 | 10 | 54 |
| 14 | 14.76 | 8 | 56770560 | 2048 | 11 | 57 |
| 15 | 15.29 | 8 | 164003840 | 4096 | 12 | 60 |
| 16 | 16.14 | 8 | 590413824 | 8192 | 13 | 63 |
| 17 | 17.46 | 4 | 5904138240 | 32768 | 15 | 66 |
| 18 | 18.46 | 8 | 11808276480 | 32768 | 15 | 69 |
| 19 | 19.09 | 8 | 36498309120 | 65536 | 16 | 72 |
| 20 | 20.22 | 8 | 160592560128 | 131072 | 17 | 75 |
| 21 | 21.55 | 4 | 1605925601280 | 524288 | 19 | 78 |
| 22 | 22.55 | 8 | 3211851202560 | 524288 | 19 | 81 |

TABLE 2

CO-MODULI AND MODULAR INVERSES FOR CHINESE REMAINDER THEOREM

| BITS/SYMBOL | CLOCK RATE1 | CLOCK RATE2 | CLOCK RATE3 | CLOCK RATE4 | CLOCK RATE5 | CLOCK RATE6 | CLOCK RATE7 | CO MODULI | | |
|---|---|---|---|---|---|---|---|---|---|---|
| 1 | 2 | | | | | | | NA | | |
| 2 | 2 | 3 | | | | | | 3 | 2 | |
| 3 | 3 | 4 | | | | | | 4 | 3 | |
| 4 | 4 | 5 | | | | | | 5 | 4 | |
| 5 | 3 | 4 | 5 | | | | | 20 | 15 | 12 |
| 6 | 2 | 5 | 7 | | | | | 35 | 14 | 10 |
| 7 | 4 | 5 | 7 | | | | | 35 | 28 | 20 |
| 8 | 3 | 4 | 5 | 7 | | | | 140 | 105 | 84 |
| 9 | 3 | 5 | 7 | 8 | | | | 280 | 168 | 120 |
| 10 | 4 | 5 | 7 | 8 | | | | 315 | 252 | 180 |
| 11 | 5 | 7 | 8 | 9 | | | | 504 | 360 | 315 |
| 12 | 3 | 4 | 5 | 7 | 11 | | | 1540 | 1155 | 924 |
| 13 | 3 | 5 | 7 | 8 | 11 | | | 3080 | 1848 | 1320 |
| 14 | 5 | 7 | 8 | 9 | 11 | | | 5544 | 3960 | 3465 |
| 15 | 5 | 7 | 8 | 11 | 13 | | | 8008 | 5720 | 5005 |
| 16 | 7 | 8 | 9 | 11 | 13 | | | 10296 | 9009 | 8008 |
| 17 | 4 | 5 | 7 | 9 | 11 | 13 | | 45045 | 36036 | 25740 |
| 18 | 5 | 7 | 8 | 9 | 11 | 13 | | 72072 | 51480 | 45045 |
| 19 | 5 | 7 | 8 | 9 | 13 | 17 | | 111384 | 79560 | 69615 |
| 20 | 7 | 8 | 9 | 11 | 13 | 17 | | 175032 | 153153 | 136136 |
| 21 | 4 | 5 | 7 | 9 | 11 | 13 | 17 | 765765 | 612612 | 437580 |
| 22 | 5 | 7 | 8 | 9 | 11 | 13 | 17 | 1225224 | 875160 | 765765 |

| BITS/SYMBOL | | MODULAR INVERSES | | | | |
|---|---|---|---|---|---|---|
| 1 | | NA | | | | |
| 2 | | 1 | −1 | | | |
| 3 | | 1 | 1 | | | |
| 4 | | 1 | −1 | | | |
| 5 | | −1 | −1 | −2 | | |
| 6 | | 1 | −1 | −2 | | |
| 7 | | −1 | 2 | −1 | | |
| 8 | 60 | −1 | 1 | −1 | 2 | |
| 9 | 105 | 1 | 2 | 1 | 1 | |
| 10 | 140 | −1 | −2 | 3 | 2 | |

TABLE 2-continued

CO-MODULI AND MODULAR INVERSES FOR CHINESE REMAINDER THEOREM

| | | | | | | | | | | | |
|---|---|---|---|---|---|---|---|---|---|---|---|
| 11 | 280 | | | | | -1 | -2 | 3 | 1 | | |
| 12 | 660 | 420 | | | 1 | -1 | -1 | -3 | -5 | | |
| 13 | 1155 | 840 | | | -1 | 2 | 2 | 3 | 3 | | |
| 14 | 3080 | 2520 | | | -1 | 3 | 1 | -4 | 1 | | |
| 15 | 3640 | 3080 | | | 2 | 1 | -3 | -1 | -1 | | |
| 16 | 6552 | 5544 | | | -1 | 1 | 4 | -3 | -2 | | |
| 17 | 20020 | 16380 | 13860 | | 1 | 1 | 1 | -2 | 1 | -6 | |
| 18 | 40040 | 32760 | 27720 | | -2 | -3 | -3 | -1 | -5 | -3 | |
| 19 | 61880 | 42840 | 32760 | | -1 | 3 | -1 | 2 | 5 | 1 | |
| 20 | 111384 | 94248 | 72072 | | 2 | 1 | -4 | 5 | 6 | 2 | |
| 21 | 340340 | 278460 | 235620 | 180180 | 1 | -2 | -2 | 2 | 2 | 5 | -6 |
| 22 | 680680 | 556920 | 471240 | 360360 | -1 | -1 | -3 | 1 | 1 | -4 | -3 |

In one exemplary embodiment, laser communications at relatively high data rates are possible while simultaneously benefitting from the sensitivity of high cardinality PPM. For the example of 1024-PPM at 1Gword/sec, the synthetic slot clock rate is $R_{slot}$=1.26 THz. The jitter of each clock and between each pair of clocks in the set must be less than $1/R_{slot}$, e.g., 800 fs pp; a value that appears reasonable given that commercial technology—e.g., Digital Communications Analyzers (DCAs)—can achieve jitter levels of 70 fs rms. To exploit the data rate and sensitivity benefit of the techniques described herein, it is beneficial to use clock synthesis techniques that produce clocks in which the jitter is low but also correlated.

In one exemplary embodiment, in a counter size example, for 1024-synthetic PPM having clocks operating a 4, 5, 7, and 9× the PPM word rate, 2, 3, 3, and 4 bit counters are required, respectively, totaling 12 bits. This total must exceed that of the number of bits per synthetic PPM word, e.g., 10. In addition, if one includes a precession counter (which decoding with CRT, a lookup table, or a similar approach, uses at the synthetic PPM word rate), 8 bits are needed for a total of 20 bits. In other words, either 12 or 20 bits of counter-state information decode to 10 channel bits per PPM word.

The number of slots of the vector PPM word (e.g., S=6 for 2×3 vector PPM) is not binary and will never equal a PPM cardinality (e.g., M=4, for QPPM). However, slot assertions at the two rates, synthetic and vector, align predictably. Phasing of the two can be maintained with a "precession counter" of the present invention.

Accordingly, the present invention includes a clock set design that can be maximally efficient (i.e., for a given number of clocks in the set, the vector PPM word has the minimal number of slots, S, in excess of the desired cardinality, M), and the mapping of states to PPM slots includes a "precession counter" that eliminates deadtime. The present invention overcomes the slot-clock and electronic rate limit and mitigates the effects of jitter, thus, enabling both high sensitivity and high data rate PPM. The implications for practical high sensitivity optical communication networks are significant.

In one exemplary embodiment, the set is used in optical communication networks (220).

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A communication system including a slot clock generator for high data rate pulse position modulation (PPM), comprising:
a set of clocks with a set of predetermined harmonically related frequencies, harmonically related to a fundamental period and having rates that are mutually prime in pairs, said set of clocks configured such that the frequency of the fastest clock of the set of harmonically related frequencies is minimized with the fundamental period divided into a number of periods where a number of synthetic divisions of the period of the fundamental frequency exceeds a specified power of two which synthesizes and accumulates changes in clock states at a rate corresponding to a slot rate that is greater than a slot rate of any single clock in said set, wherein a lookup table is used to synthesize said slot rate of said clock states by solving a set of simultaneous modular equations on said clock states by producing a composite modulus that is larger than a cardinality of a PPM signal selected from wavelength and polarization, optionally with pulse-position modulating at a set of four wavelengths; and
further comprising:
a precession counter which maintains phasing of a PPM slot rate to said synthetic slot clock, by at least one of re-mapping said synthetic clock slot to a modulus slot, resetting clock-set counters at an end of each PPM word, or introducing dead times after each PPM word to align each of said clock states to a PPM word boundary, thereby lowering a data rate whereby a corresponding single scalar PPM slot rate differs for each modulated wavelength with the vector-PPM word rate held to a predetermined ratio.

2. The communication system of claim 1, wherein said set is used in optical communication networks.

* * * * *